United States Patent [19]

Harp

[11] 3,893,040

[45] July 1, 1975

[54] DIGITAL AUTOMATIC FREQUENCY CONTROL SYSTEM

[75] Inventor: Maurice C. Harp, Belmont, Calif.

[73] Assignee: GTE Automatic Electric Laboratories Incorporated, Northlake, Ill.

[22] Filed: Mar. 27, 1974

[21] Appl. No.: 455,109

[52] U.S. Cl. .......................... 331/14; 331/18; 332/19

[51] Int. Cl.² .......................... H03B 3/04

[58] Field of Search .................. 331/1 A, 14, 18, 25; 332/19

[56] References Cited

UNITED STATES PATENTS

| | | | |
|---|---|---|---|
| 3,259,851 | 7/1966 | Brauer | 331/1 A X |
| 3,370,252 | 2/1968 | Zoerner | 331/1 A X |
| 3,568,083 | 3/1971 | Harzer | 331/1 A X |

*Primary Examiner*—Siegfried H. Grimm
*Attorney, Agent, or Firm*—Douglas M. Gilbert; Leonard R. Cool

[57] ABSTRACT

This invention relates to an automatic frequency control system wherein analog and digital techniques are utilized to detect and correct an off-frequency condition of a controlled oscillator. Digital circuits determine the operating frequency of this oscillator and produce a discrete error voltage when an off-frequency condition exists. The error voltage is then fed back to the oscillator for use in correcting the off-frequency condition.

6 Claims, 3 Drawing Figures

DIGITAL AUTOMATIC FREQUENCY CONTROL SYSTEM

BACKGROUND OF THE INVENTION

1. Field of the Invention

In radio communication systems, automatic frequency control (AFC) techniques are particularly useful in stabilizing the center frequency of frequency or phase modulated oscillators. The techniques locking an unmodulated free-running oscillator to a particular frequency are well known in the prior art. However, when an oscillator becomes frequency or phase modulated and when other objectives are considered, sophisticated techniques must be used if acceptable results are to be obtained.

2. Description of the Prior Art

A number of prior techniques have been developed to automatically control the frequency of free-running oscillators. Probably the oldest and simplest method is the use of an AFC discriminator with a feedback loop connected to the controlled oscillator. However, AFC discriminators, built with ordinary inductors and capacitors, are very unstable. These components change value over a period of time and with a change in temperature, thereby causing the controlled oscillator to drift in frequency. Discriminators of quartz crystals are very stable but yield very narrow control bandwidths. This means that the effective range of frequency control is very limited, and often the system malfunctions upon initial startup when the frequency of the controlled oscillator starts beyond the range of the discriminator's control. Furthermore, narrow-band discriminators suffer from their inability to accept intentional wideband frequency modulation (FM) which exceeds the bandwidth of the discriminator.

Another technique is to compare a precision frequency reference with the frequency of the controlled oscillator in a phase comparator. Since phase is related to frequency, any variation in frequency is detected as a phase change. Such automatic phase control (APC) circuits provide excellent control to the accuracy of the reference oscillator, but they, like the crystal discriminator, suffer from their inability to accept intentional wideband FM or phase modulation (a modulation index greater than 2 causes difficulty). APC techniques are also limited in their ability to quickly acquire control on initial startup when large initial frequency errors exist. Optimizing APC loops for quick acquisition is unfortunately completely contrary to loop optimization for tolerance to wideband FM.

A further problem with APC systems is encountered during the acquisition period. The frequency of the controlled oscillator during initial startup can become driven away from the target frequency from which point control may never be recovered. And if control is recovered, there probably will be a period of transient frequency excursions of considerable magnitude. Such excursions are unacceptable in high quality communication systems.

By contrast, the AFC system in accordance with the present invention has a very short acquisition time, and cannot cause the controlled oscillator to be driven from the target frequency. (A typical acquisition time for the system described herein is less than 300 ms). Further, it is virtually impossible to break the system frequency lock when the effective range of control of this invention is twice the desired target frequency. The improvement of this AFC system is obvious when contrasted with a crystal AFC discriminator, which typically has a control range of 1% of the target frequency. This system's wide control range coupled with the process of integrating the error signal makes the AFC system described herein immune to a carrier with wideband FM.

SUMMARY OF THE INVENTION

It is an object of this invention to provide an improved automatic frequency control system using digital and analog techniques.

More specifically, in one embodiment of this invention, a portion of the controlled oscillator's output is continuously applied to one input of a binary counter. A reset input to this counter precisely controls the time period when the counter is activated or deactivated. The reset input is connected to a precision timing circuit for control purposes. The binary counter acts like a decision circuit to determine whether the frequency count is higher or lower than a predetermined target frequency. If an off-frequency condition is determined to exist, a correction voltage is generated and fed back to the controlled oscillator for resetting of the carrier frequency.

BRIEF DESCRIPTION OF THE DRAWINGS

The above and other features of the invention will be considered in the following specification in connection with the accompanying drawings in which.

DESCRIPTION OF THE PREFERRED EMBODIMENT

Figure 1:
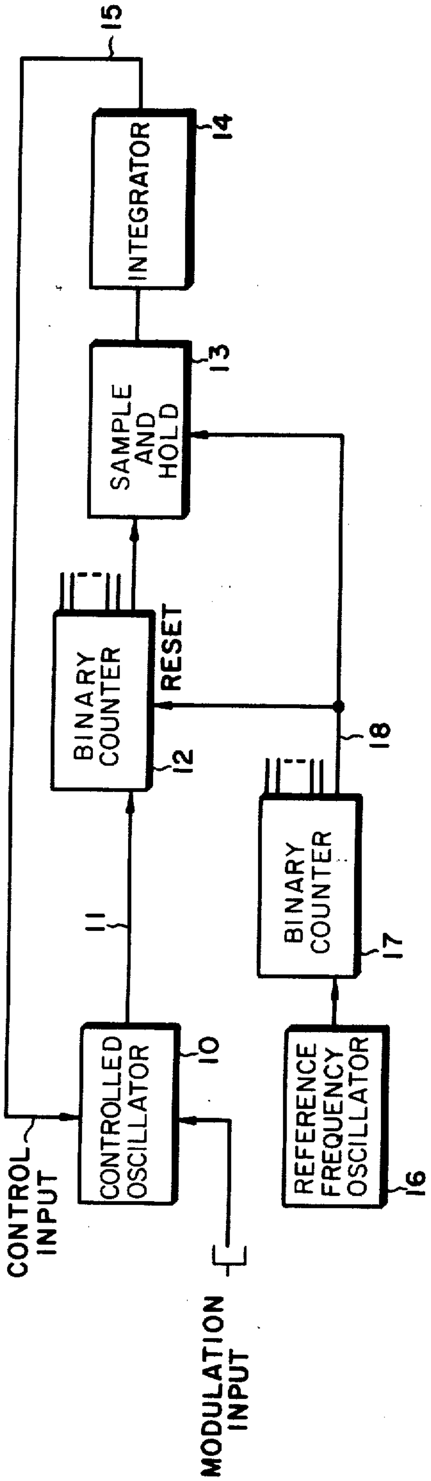
FIG. 1 is a block diagram of one embodiment of the invention.

Directing attention to FIG. 1, the output of controlled oscillator 10 is coupled via lead 11 to binary counter 12. A stable reference oscillator 16 produces a reference frequency signal which is coupled to binary counter 17. The output of binary counter 17 produces a logic signal 18 that controls the operation of binary counter 12 and sample-and-hold circuit 13. When binary counter 17 activates binary counter 12, by the presence of a 1 on the reset input via lead 18, counter 12 provides a digital binary output (1 or 0) indicating that the calculated frequency of controlled oscillator 10 is either higher or lower than the predetermined target frequency. This output voltage from counter 12 is sampled and held by sample-and-hold circuit 13 until another frequency count is taken. The output from sample-and-hold circuit 13 is integrated by integrator circuit 14 which provides via lead 15 a smooth feedback control voltage to controlled oscillator 10.

In the manufacture of the preferred embodiment of this invention, digital integrated circuits were used for the basic logic elements. Cascaded 4-bit binary counters, type 7493, manufactured by Texas Instruments Incorporated, were used satisfactorily for both binary counters described herein. A type-D flip flop with a type number of 7474 was used for the sample-and-hold circuit. Although a more sophisticated integrator circuit could be used for integrator 14, a passive RC circuit was found to be quite adequate.

Figure 2:
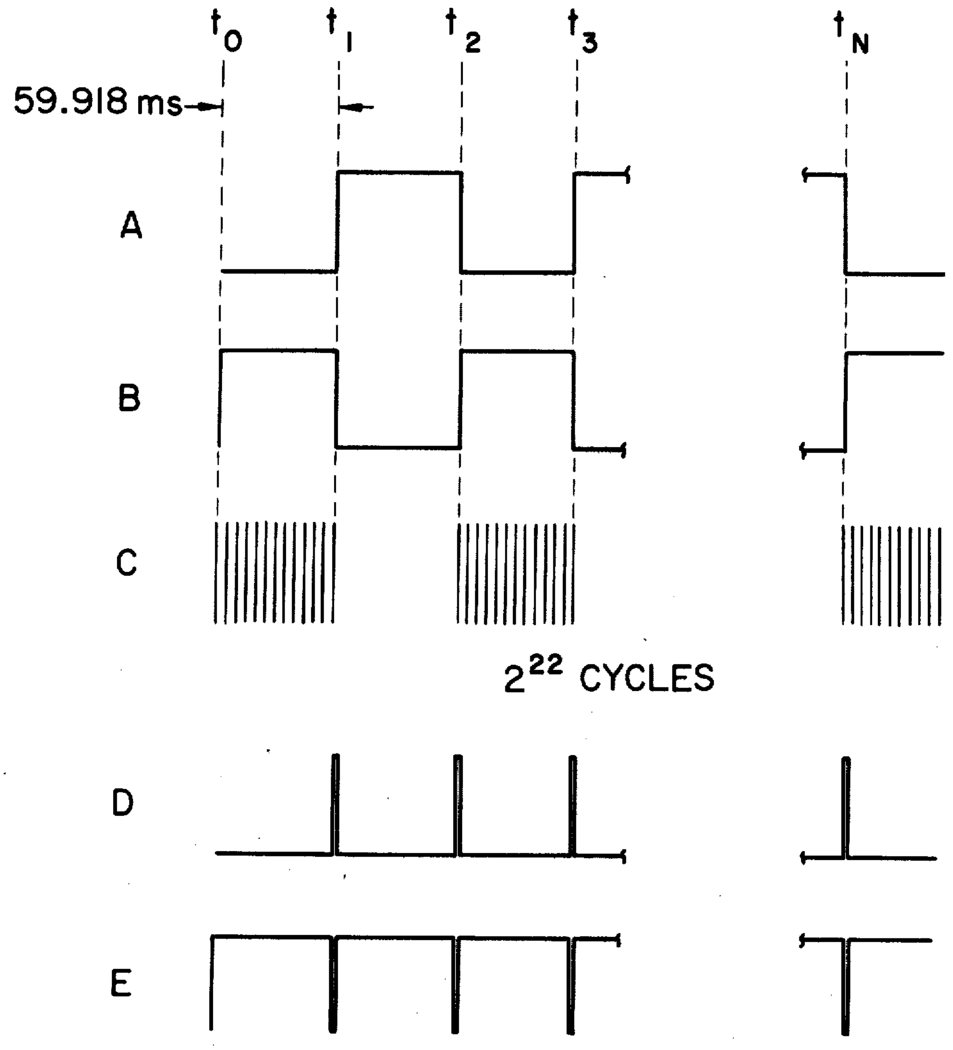
FIG. 2 shows the various waveforms which are helpful in understanding the operation of the invention.

The unique properties of this AFC system may be best explained and understood by reference to the waveforms of FIG. 2. It should also be kept in mind that the particular frequencies and time intervals given below are for purposes of illustration only and not unique to the operation of this system.

Referring to FIG. 1, the reference frequency oscillator 16 may be a quartz controlled oscillator or other signal source having a suitable frequency stability. The frequency of oscillator 16 can be the same as the controlled oscillator target frequency or related to it by an integral fraction thereof. Factors such as availability, convenience, simplicity, and economics should be evaluated in choosing this frequency.

The controlled oscillator 10 is shown in FIG. 1 as having a "modulation input." This input would be used when the controlled oscillator 10 was either frequency modulated or phase modulated. The ability of this AFC system to maintain the center frequency of a modulated oscillator is an important feature of the invention.

Digital binary counters 12 and 17 have $n$ independent outputs each representing a count of $2^n$ Hertz ($n$ being a whole number). This feature is extremely useful as will later be seen. Since all counting is done in terms of binary logic, the frequencies mentioned are given in powers of 2 for convenience.

For purposes of illustration, the reference frequency oscillator 16 will be assumed to be at $\frac{1}{2^4}$ of the frequency target of controlled oscillator 10. The predetermined target frequency of controlled oscillator 10 will be given as 70 MHz. Then the frequency of reference control oscillator 16 must be 4375 kHz (1/16th of 70 MHz). The output signal from the reference control oscillator is continuously applied to the input of binary counter 17. The 18th output of counter 17 (which corresponds to a frequency count of $2^{18}$ cycles) is applied to the reset input of counter 12 and sample-and-hold circuit 13 via lead 18. The tandem connection of reference generator 16 and binary counter 17 produces a precision waveform used as the timing reference for the system. This $2^{18}$ output is a square wave having a duration equal to 2 × 59.918 ms and a 50% duty cycle. (Refer to waveform A of FIG. 2). Due to the sense of the internal logic circuits of the counters and the sample-and hold circuit, the inverted output from counter 17 is used. This is shown as waveform B in FIG. 2, and is applied via connection 18 to binary counter 12. This control signal is used to activate (1) and deactivate (0) counter 12, so that for precisely 59.918 ms counter 12 will count the frequency of the applied signal on lead 11.

Binary counter 12 has $n$ number of outputs; however, in this example, the output which represents a count of $2^{22}$ is the only output of interest. This is so because during an interval of 59.918 ms there are precisely $2^{22}$ cycles in a 70 MHz signal. Although the 70 MHz signal 11 is continuously applied to binary counter 12, the effective signal being counted is shown diagrammatically in FIG. 2 as waveform C.

If the controlled oscillator frequency drifts lower than the predetermined target frequency of exactly 70 MHz, the frequency count in a 59.918 ms interval will be less than $2^{22}$ counts. In binary logic terms all frequencies less than $2^{22}$ will yield a 0 on the $2^{22}$ output and all frequencies between $2^{22}$ and $2^{23}$ will yield a 1 on the $2^{22}$ output. It is clear then that one needs only to examine the state of the $2^{22}$ output to determine whether the controlled oscillator frequency is higher or lower than the predetermined target frequency.

The 0 or 1 from the $2^{22}$ output is stored in sample-and-hold circuit 13. The control circuitry of sample and hold 13 is adjusted to sample at time $t_1$ (refer to FIG. 2) and to hold that sampled voltage from $t_1$ to $t_3$ (in the above example this is approximately 120 ms). The information stored from $t_1$ to $t_3$ is then integrated over a sufficient number of counts so as to yield a substantially smooth average of the correction voltage required. This DC correction voltage is then fed back to control input of controlled oscillator 10 for correction of the frequency. In any application of this circuit, the gate period and integration time must be balanced against the effect rapid correction has upon any frequency modulation present on the controlled oscillator's output. (This is explained further below).

Figure 3:
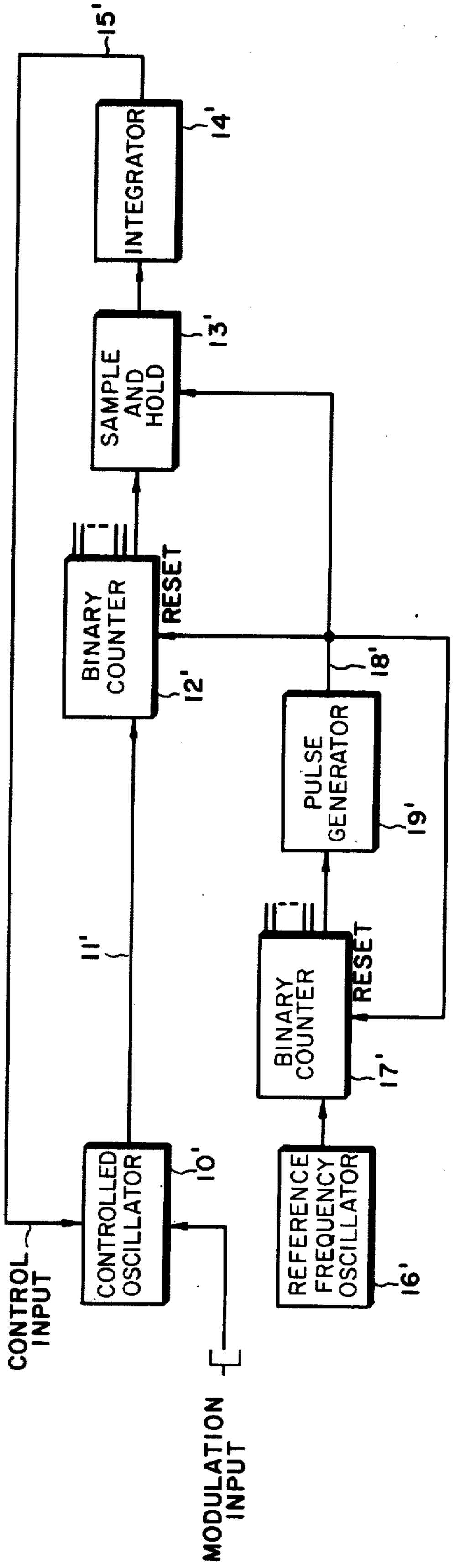
FIG. 3 is a block diagram of another embodiment of this invention.

FIG. 3 shows another embodiment of this invention. This embodiment is basically the same as in FIG. 1 with the addition of pulse generator 19'.

The addition of pulse generator 19' (a monostable multivibrator) provides increased efficiency over the invention shown in FIG. 1. At the end of each gate period ($t_1$), pulse generator 19' produces a resetting pulse of relatively short duration. Pulse generator 19' produces a pulse waveform as shown by D in FIG. 2, but due to the sense of the internal logic circuit of counters 12' and 17' and sample and hold circuit 13', the inverted waveform E is applied at 18' in FIG. 3 by an inverted output of pulse generator 19'. An inverter circuit is not specifically required since pulse generator 19' provides both an inverted and noninverted output. The leading edge of this pulse triggers sample-and-hold circuit 13' to read the $2^{22}$ output from binary counter 12' before it is reset to a zero count. And the trailing edge of the reset pulse is used to simultaneously reset both binary counters 12' and 17' to a zero count. The actual time required to read and reset all circuits is in the order of 25 ns. Thus, both counters 12' and 17' (and hence the entire system) are virtually in continuous operation.

To optimize the efficiency of this invention, pulse generator 19' is adjusted to keep the reset period at an absolute minimum. However, this resetting pulse is not essential for the AFC system to operate. If pulse generator 19' is eliminated, as shown in FIG. 1, the system will function as described above, but it will only provide one-half the information provided with pulse generator 19' added.

The accuracy of the AFC system and its rate or speed of correction depend on the controlled oscillator target frequency and the sampling period of the controlled oscillator output. If the controlled oscillator target frequency is 70 MHz, as above, and the sampling period is 60 ms, a frequency error less than 16 Hz cannot be resolved by the system. This system accuracy can be improved upon by increasing the length of the sampling period. However, this would cause a corresponding decrease in the system's speed of correction. Since fewer samples would be taken in any given period of time, fewer voltage corrections would be available to the controlled oscillator 10.

The speed of correction is also dependent upon the integration time constant of the integrator. This time constant is made intentionally long compared to the lowest modulating frequency of the controlled oscillator. Although a long time constant slows the system response time, this must be done to some degree to prevent low frequency noise from being fed back to the controlled oscillator correction voltage input. If this were permitted, the unwanted signals would modulate the controlled oscillator carrier and appear as low frequency coherent noise on the controlled oscillator output. For the frequencies and periods given above in FIG. 3, a time constant of 250 ms works quite adequately in message systems (300 Hz being the lowest modulating frequency). And in video communication systems, a time constant of several seconds is necessary to eliminate the lower frequency noise from the feedback loop.

What is claimed is:

1. An automatic frequency control system wherein the frequency of an oscillator is periodically determined during intervals of time precisely controlled to derive indications of the frequency thereof for controlling said frequency, said system comprising:

a frequency controllable oscillator;

timing means producing timing signals defining a precise predetermined interval of time;

a binary counting means, responsive to the oscillator output signal and to the timing means for counting the number of cycles in the oscillator output signal during each predetermined interval of time, and producing a binary signal of one state when said number of cycles is greater than a predetermined number and a binary signal of the opposite state when said number of cycles is less than the predetermined number;

a first means for converting said binary signal to an analog signal at the end of each time interval; and a second means coupling the analog signal to said oscillator for increasing or decreasing the frequency thereof in accordance with the binary indication.

2. An automatic frequency control system as defined in claim 1 wherein said frequency controllable oscillator is a frequency modulated oscillator having an output circuit, a frequency control input circuit, and a modulating input circuit; said frequency control input circuit capable of varying the output center frequency.

3. An automatic frequency control system as defined in claim 1 wherein said frequency controllable oscillator is a phase modulated oscillator having an output circuit, a frequency control input circuit, and a modulating input circuit; said frequency control input circuit capable of varying the output center frequency.

4. An automatic frequency control system as defined in claim 1 wherein said first means comprises a sample-and-hold circuit coupled to an integrator circuit.

5. An automatic frequency control system as defined in claim 1 wherein said timing means comprises:

a frequency stable reference oscillator; and means responsive to said reference oscillator for generating a binary pulse having a pulse width defined by a predetermined number of cycles from said reference oscillator.

6. An automatic frequency control system as defined in claim 1 wherein said timing means comprises:

a frequency stable reference oscillator; and means responsive to said reference oscillator for generating a binary pulse, having a pulse width that is less than the time between binary pulses, and having a precise repetition rate, said repetition rate being defined by a predetermined number of cycles from said reference oscillator.

* * * * *